(12) United States Patent
Yeon et al.

(10) Patent No.: US 12,473,645 B2
(45) Date of Patent: *Nov. 18, 2025

(54) METHOD FOR FORMING THIN FILM

(71) Applicant: SOULBRAIN CO., LTD., Seongnam-si (KR)

(72) Inventors: Changbong Yeon, Seongnam-si (KR); Jaesun Jung, Seongnam-si (KR); Hyeran Byun, Seongnam-si (KR); Taeho Song, Seongnam-si (KR); Sojung Kim, Seongnam-si (KR); Seokjong Lee, Seongnam-si (KR)

(73) Assignee: SOULBRAIN CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/749,153

(22) Filed: May 20, 2022

(65) Prior Publication Data

US 2022/0275511 A1 Sep. 1, 2022

Related U.S. Application Data (62) Division of application No. 16/734,423, filed on Jan. 6, 2020, now Pat. No. 12,252,788.

(30) Foreign Application Priority Data

Sep. 25, 2019 (KR) .................. 10-2019-0118417
Oct. 31, 2019 (KR) .................. 10-2019-0137838

(51) Int. Cl.
C23C 16/40 (2006.01)
C23C 16/30 (2006.01)
(Continued)

(52) U.S. Cl.
CPC ...... *C23C 16/45544* (2013.01); *C23C 16/303* (2013.01); *C23C 16/34* (2013.01); (Continued)

(58) Field of Classification Search
None
See application file for complete search history.

(56) References Cited

U.S. PATENT DOCUMENTS

2006/0099831 A1* 5/2006 Borovik ............ H01L 21/02219
438/794
2012/0052681 A1* 3/2012 Marsh ............... H01L 21/02175
438/763

(Continued)

FOREIGN PATENT DOCUMENTS

JP 2018006753 A 1/2018

OTHER PUBLICATIONS

Echemi "What is 1,2,2,3-Tetrachloroproane"> Sigma-A from https://www.echemi.com/products/pd1180521131103-1-2-2-3-tetrachloropropane.html. on Jan. 18, 2023 (Year: 2023).*

(Continued)

*Primary Examiner* — Mandy C Louie
(74) *Attorney, Agent, or Firm* — SZDC Law PC (57) ABSTRACT

The present invention relates to a method for forming a thin film, and more particularly, to a method for forming a thin film comprising steps of:
i) adsorbing a growth inhibitor for forming a thin film on a surface of a substrate; and ii) adsorbing a metal film precursor, metal oxide film precursor, metal nitride film precursor or silicon nitride film precursor on a surface of a substrate on which the growth inhibitor is adsorbed, wherein the growth inhibitor for forming a thin film is represented by Chemical Formula 1 below, and the metal is at least one selected from a group (Continued)

<TSI-TiCl₄ ALD> consisting of tungsten, cobalt, chrome, aluminum, hafnium, vanadium, niobium, germanium, lanthanide, actinoids, gallium, tantalum, zirconium, ruthenium, copper, titanium, is nickel, iridium and molybdenum.

$A_n B_m X_o$ [Chemical Formula 1]

wherein A is carbon or silicon, B is hydrogen or a C1-C3 alkyl, X is a halogen, n is an integer of 1 to 15, o is an integer of 1 or more, and m is 0 to 2n+1.

According to the present invention, it is possible to suppress side reactions to appropriately lower a thin film growth rate and remove process byproducts in the thin film, thereby preventing corrosion or deterioration and greatly improving step coverage and thickness uniformity of a thin film, even when the thin film is formed on a substrate having a complex structure.

14 Claims, 3 Drawing Sheets

(51) Int. Cl.
  *C23C 16/34* (2006.01)
  *C23C 16/455* (2006.01)
  *H01L 21/285* (2006.01)
  *H01L 21/768* (2006.01)

(52) U.S. Cl.
  CPC ...... *C23C 16/405* (2013.01); *C23C 16/45534* (2013.01); *H01L 21/28568* (2013.01); *H01L 21/76841* (2013.01)

(56) References Cited

U.S. PATENT DOCUMENTS

2018/0005836 A1\* 1/2018 Lim ............... H01L 21/76829
2018/0245215 A1\* 8/2018 Lei ................. H01L 21/02211
2018/0315840 A1   11/2018 Chui et al.
2019/0017170 A1\* 1/2019 Sharma ........... H01L 21/02181

OTHER PUBLICATIONS

ILO "Trimethylchlorosilane" <https://www.ilo.org/dyn/icsc/showcard.display?p_lang=en&p_card_id=0966&p_version=2> accessed on Sep. 26, 2023 (Year: 2023).\*

PubChem 2methyl 1pentene [https://pubchem.ncbi.nlm.nih.gov/compound/2-Methyl-1-pentene#section=Flash-Point]. (Year: 2024).\*

\* cited by examiner

FIG. 1

CONVENTIONAL TiCl₄ ALD

FIG. 2

<TSI-TiCl₄ ALD>

| SAMPLE | TOP | BOTTOM | STEP COVERAGE(%) |
|---|---|---|---|
| EXAMPLE 1 (SP-TiCl$_4$) | | | 92% |
| COMPARATIVE EXAMPLE 1 (TiCl$_4$) | | | 78% |

FIG. 6

METHOD FOR FORMING THIN FILM

CROSS-REFERENCE TO RELATED APPLICATIONS

This application claims priority under 35 U.S.C. § 119 to Korean Patent Application No. 10-2019-0118417, filed on Sep. 25, 2019, and Korean Patent Application No. 10-2019-0137838, filed on Oct. 31, 2019, in the Korean Intellectual Property Office, the disclosures of which are incorporated herein by reference in their entirety.

TECHNICAL FIELD

The following disclosure relates to a method for forming a thin film, and more particularly, to a method for forming a thin film capable of suppressing side reactions to appropriately lower the thin film growth rate and remove process byproducts in the thin film, thereby preventing corrosion or deterioration and greatly improving the step coverage and thickness uniformity of a thin film even when the thin film is formed on a substrate having a complex structure.

BACKGROUND

The degree of integration of memory and non-memory semiconductor devices is increasing day by day. As the structure thereof becomes more and more complex, the importance of step coverage in the deposition of various thin films on a substrate is gradually increasing.

A thin film for a semiconductor is made of a metal nitride, metal oxide, metal silicide, or the like. Metal nitride thin films include titanium nitride (TiN), tantalum nitride (TaN), zirconium nitride (ZrN), and the like. The thin films are generally used as a diffusion barrier between the silicon layer of a doped semiconductor and an interlayer wiring material such as aluminum (Al), copper (Cu), or the like. However, when a tungsten (W) thin film is deposited on the substrate, the tungsten (W) thin film is used as an adhesion layer.

In order to obtain a thin film having excellent and uniform physical properties when deposited on the substrate, it is essential that the formed thin film have a high step coverage. Therefore, an atomic layer deposition (ALD) process employing a surface reaction, rather than a chemical vapor deposition (CVD) process mainly employing a gas phase reaction, is utilized; however, there are still problems for realization of 100% step coverage.

In addition, in the case of using titanium tetrachloride ($TiCl_4$) to deposit titanium nitride (TiN), a representative material among the metal nitrides, process by-products such as chlorides remain in the prepared thin film, causing corrosion of metals such as aluminum, and the like, and the production of non-volatile byproducts leads to deterioration of film quality.

Therefore, it is necessary to develop a method for forming a thin film which is capable of forming a thin film having a complex structure and which does not lead to corrosion of an interlayer wiring material.

DOCUMENTS OF THE RELATED ART (Patent Document 1) Korean Patent Laid-Open Publication No. 2006-0037241

SUMMARY

An embodiment of the present disclosure is directed to providing a method for forming a thin film capable of suppressing side reactions to appropriately lower the growth rate of the thin film and remove process byproducts therein, thereby preventing corrosion or deterioration and greatly improving the step coverage and thickness uniformity of the thin film, even when the thin film is formed on a substrate having a complex structure.

All of the above objects and other objects of the present disclosure can be achieved by the present disclosure described below.

To achieve the above-mentioned objects, the present disclosure presents a method for forming a thin film comprising steps of:

i) adsorbing a growth inhibitor for forming a thin film on a surface of a substrate; and ii) adsorbing a metal film precursor, metal oxide film precursor, metal nitride film precursor or silicon nitride film precursor on a surface of a substrate on which the growth inhibitor is adsorbed, wherein the growth inhibitor for forming a thin film is represented by Chemical Formula 1 below, and the metal is at least one selected from a group consisting of tungsten, cobalt, chrome, aluminum, hafnium, vanadium, niobium, germanium, lanthanide, actinoids, gallium, tantalum, zirconium, ruthenium, copper, titanium, nickel, iridium and molybdenum.

$$A_nB_mX_o \quad \text{[Chemical Formula 1]}$$

wherein A is carbon or silicon, B is hydrogen or a C1-C3 alkyl, X is a halogen, n is an integer of 1 to 15, o is an integer of 1 or more, and m is 0 to 2n+1.

In addition, the present invention relates to an apparatus for preparing a thin film, comprising an atomic layer deposition (ALD) chamber, a first vaporizer for vaporizing the growth inhibitor for forming a thin film, a first transfer unit for transferring the vaporized growth inhibitor into the ALD chamber, a second vaporizer for vaporizing a metal film precursor, metal oxide film precursor, metal nitride film precursor or silicon nitride film precursor, and a second transfer unit for transferring the vaporized thin film precursor into the ALD chamber.

DETAILED DESCRIPTION OF EMBODIMENTS

Hereinafter, a method for forming a thin film is described in detail.

The present inventors found that when a halogen-substituted compound having a predetermined structure is first adsorbed as a growth inhibitor before the adsorption of a thin film precursor compound on a surface of a substrate loaded inside an atomic layer deposition (ALD) chamber, the growth rate of the thin film to be formed after deposition is lowered and a significant reduction of the halides remaining as process byproducts is achieved, thereby greatly improving step coverage, and the like. Based on this finding, the present inventors made a significant effort on further research and thereby completed the present disclosure.

The method for forming a thin film of the present disclosure is characterized by comprising steps of i) adsorbing a growth inhibitor for forming a thin film on a surface of a substrate; and ii) adsorbing a metal film precursor, metal oxide film precursor, metal nitride film precursor or silicon nitride film precursor on a surface of a substrate on which the growth inhibitor is adsorbed, wherein the growth inhibitor for forming a thin film is represented by Chemical Formula 1 below, and the metal is at least one selected from a group consisting of tungsten, cobalt, chrome, aluminum, hafnium, vanadium, niobium, germanium, lanthanide, actinoids, gallium, tantalum, zirconium, ruthenium, copper, titanium, nickel, iridium and molybdenum.

$$A_nB_mX_o \quad \text{[Chemical Formula 1]}$$

wherein A is carbon or silicon, B is hydrogen or a C1-C3 alkyl, X is a halogen, n is an integer of 1 to 15, o is an integer of 1 or more, and m is 0 to 2n+1. In this case, side reactions occurring during formation of the thin film may be suppressed to lower the thin film growth rate while also achieving removal of process byproducts in the thin film, and thus corrosion or deterioration may be reduced and step coverage and thickness uniformity of a thin film may be greatly improved even when the thin film is formed on a substrate having a complex structure.

In the step of i) adsorbing the growth inhibitor for forming a thin film on the surface of the substrate, the feeding time per cycle for the growth inhibitor is preferably 1 to 10 seconds, more preferably 1 to 5 seconds, even more preferably 2 to 5 seconds, and still more preferably 2 to 4 seconds. Within this range, there are advantages in that the thin film growth rate is low, and the step coverage and economic feasibility are excellent.

The feeding time of the growth inhibitor for forming a thin film in the present disclosure is based on a chamber having a volume of 15 to 20 L at a flow rate of 0.5 to 5 mg/s, and more specifically, a chamber having a volume of 18 L at a flow rate of 1 to 2 mg/s.

The step of i) adsorbing the growth inhibitor for forming a thin film on the surface of the substrate may preferably comprise a step of injecting the growth inhibitor for forming a thin film into an atomic layer deposition (ALD) chamber and adsorbing the growth inhibitor onto a surface of a loaded substrate, and thereby suppressing side reactions, lowering the deposition rate to lower the growth rate of the thin film, and removing process byproducts in the thin film.

The step of i) adsorbing the growth inhibitor for forming a thin film on the surface of the substrate may preferably comprise a step of purging the remaining inhibitor unadsorbed on a surface of the substrate for forming the thin film with a purge gas, and thereby suppressing side reactions to lower the growth rate of the thin film and to remove process byproducts in the thin film, thereby greatly improving the step coverage and thickness uniformity of the thin film even when the thin film is formed on a substrate having a complex structure.

In addition, the step of ii) adsorbing a metal film precursor, metal oxide film precursor, metal nitride film precursor or silicon nitride film precursor (hereinafter 'thin film precursor') may preferable comprise a step of purging the remaining unadsorbed thin film precursor with a purge gas.

The method for forming a thin film may preferably comprise steps of supplying a reaction gas after adsorption of a thin film precursor on the surface of the substrate, and purging reaction byproducts of the thin film precursor and the reaction gas with a purge gas.

In one preferred embodiment, the method for forming a thin film may comprise steps of: a) vaporizing the growth inhibitor for forming a thin film and adsorbing the growth inhibitor on a surface of a substrate loaded in an atomic layer deposition (ALD) chamber; b) primary purging of the inside of the ALD chamber with a purge gas; c) vaporizing a film precursor and adsorbing the thin film precursor compound on the surface of the substrate loaded in the ALD chamber; d) secondary purging of the inside of the ALD chamber with a purge gas; e) supplying a reaction gas into the ALD chamber; and f) tertiary purging of the inside of the ALD chamber with a purge gas. In this case, there are advantages in that the thin film growth rate is appropriately lowered and the process byproducts which may be generated are effectively removed even if the deposition temperature is increased at the time of formation of the thin film, and thus the specific resistance of the thin film is reduced and the step coverage is greatly improved.

The growth inhibitor for forming a thin film and the film precursor may preferably be transferred into the ALD chamber, namely to the surface of the substrate, by a vapor flow control (VFC) method, a delivery liquid injection (DLI) method or a liquid delivery system (LDS) method, and may more preferably be transferred into the ALD chamber by the LDS method.

The ratio of the feeding amount (mg/cycle) between the growth inhibitor for forming a thin film and the film precursor in the ALD chamber may preferably be from 1:1.5 to 1:20, more preferably from 1:2 to 1:15, even more preferably from 1:2 to 1:12, and still more preferably from 1:2.5 to 1:10. Within this range, a high reduction rate of the thin film growth rate (GPC) per cycle and a great reduction of the process byproducts may be achieved.

The film precursor to be employed is not particularly limited as long as it is a thin film precursor generally used in the ALD method.

The metal film precursor, the metal oxide film precursor, and the metal nitride film precursor may each be one or more selected from the group consisting of, for example, a metal halide, a metal alkoxide, an alkyl metal compound, a metal amino compound, a metal carbonyl compound, a substituted or unsubstituted cyclopentadienyl metal compound, and the like, but the precursor is not limited thereto.

As a specific example, the metal film precursor, the metal oxide film precursor, and the metal nitride film precursor may each be one or more selected from the group consisting of tetrachlorotitan, tetrachlorogermanium, tetrachlorotin, tris(isopropyl)ethylmethyl aminogermanium, tetraethoxylgermanium, tetramethyl tin, tetraethyl tin, bisacetylacetonate tin, trimethylaluminum, tetrakis(dimethylamino)germanium, bis(n-butylamino) germanium, tetrakis(ethylmethylamino) tin, tetrakis(dimethylamino)tin, $Co_2(CO)_8$(dicobalt octacarbonyl), Cp2Co(biscyclopentadienylcobalt), $Co(CO)_3(NO)$ (cobalt tricarbonyl nitrosyl), and $CpCo(CO)_2$(cobalt dicarbonyl cyclopentadienyl and the like, but the precursor is not limited thereto.

The silicon nitride film precursor, for example, may be one or more selected from the group consisting of (NH$_2$)Si(NHMe)$_3$, (NH$_2$)Si(NHEt)$_3$, (NH$_2$)Si(NH$^n$Pr)$_3$, (NH$_2$)Si(NH$^i$Pr)$_3$, (NH$_2$)Si(NH$^n$Bu)$_3$, (NH$_2$)Si(NH$^i$Bu)$_3$, (NH$_2$)Si(NH$^t$Bu)$_3$, (NMe$_2$)Si(NHMe)$_3$, (NMe$_2$)Si(NHEt)$_3$, (NMe$_2$)Si(NH$^n$Pr)$_3$, (NMe$_2$)Si(NH$^i$Pr)$_3$, (NMe$_2$)Si(NH$^n$Bu)$_3$, (NMe$_2$)Si(NH$^i$Bu)$_3$, (NMe$_2$)Si(NH$^t$Bu)$_3$, (NEt$_2$)Si(NHMe)$_3$, (NEt$_2$)Si(NHEt)$_3$, (NEt$_2$)Si(NH$^n$Pr)$_3$, (NEt$_2$)Si(NH$^i$Pr)$_3$, (NEt$_2$)Si(NH$^n$Bu)$_3$, (NEt$_2$)Si(NH$^i$Bu)$_3$, (NEt$_2$)Si(NH$^t$Bu)$_3$, (N$^n$Pr$_2$)Si(NHMe)$_3$, (N$^n$Pr$_2$)Si(NHEt)$_3$, (N$^n$Pr$_2$)Si(NH$^n$Pr)$_3$, (N$^n$Pr$_2$)Si(NH$^i$Pr)$_3$, (N$^n$Pr$_2$)Si(NH$^n$Bu)$_3$, (N$^n$Pr$_2$)Si(NH$^i$Bu)$_3$, (N$^n$Pr$_2$)Si(NH$^t$Bu)$_3$, (N$^i$Pr$_2$)Si(NHMe)$_3$, (N$^i$Pr$_2$)Si(NHEt)$_3$, (N$^i$Pr$_2$)Si(NH$^n$Pr)$_3$, (N$^i$Pr$_2$)Si(NH$^i$Pr)$_3$, (N$^i$Pr$_2$)Si(NH$^n$Bu)$_3$, (N$^i$Pr$_2$)Si(NH$^i$Bu)$_3$, (N$^i$Pr$_2$)Si(NH$^t$Bu)$_3$, (N$^n$Bu$_2$)Si(NHMe)$_3$, (N$^n$Bu$_2$)Si(NHEt)$_3$, (N$^n$Bu$_2$)Si(NH$^n$Pr)$_3$, (N$^n$Bu$_2$)Si(NH$^i$Pr)$_3$, (N$^n$Bu$_2$)Si(NH$^n$Bu)$_3$, (N$^n$Bu$_2$)Si(NH$^i$Bu)$_3$, (N$^n$Bu$_2$)Si(NH$^t$Bu)$_3$, (N$^i$Bu$_2$)Si(NHMe)$_3$, (N$^i$Bu$_2$)Si(NHEt)$_3$, (N$^i$Bu$_2$)Si(NH$^n$Pr)$_3$, (N$^i$Bu$_2$)Si(NH$^i$Pr)$_3$, (N$^i$Bu$_2$)Si(NH$^n$Bu)$_3$, (N$^i$Bu$_2$)Si(NH$^i$Bu)$_3$, (N$^i$Bu$_2$)Si(NH$^t$Bu)$_3$, (N$^t$Bu$_2$)Si(NHMe)$_3$, (N$^t$Bu$_2$)Si(NHEt)$_3$, (N$^t$Bu$_2$)Si(NH$^n$Pr)$_3$, (N$^t$Bu$_2$)Si(NH$^i$Pr)$_3$, (N$^t$Bu$_2$)Si(NH$^n$Bu)$_3$, (N$^t$Bu$_2$)Si(NH$^i$Bu)$_3$, (N$^t$Bu$_2$)Si(NH$^t$Bu)$_3$, (NH$_2$)$_2$Si(NHMe)$_2$, (NH$_2$)$_2$Si(NHEt)$_2$, (NH$_2$)$_2$Si(NH$^n$Pr)$_2$, (NH$_2$)$_2$Si(NH$^i$Pr)$_2$, (NH$_2$)$_2$Si(NH$^n$Bu)$_2$, (NH$_2$)$_2$Si(NH$^i$Bu)$_2$, (NH$_2$)$_2$Si(NH$^t$Bu)$_2$, (NMe$_2$)$_2$Si(NHMe)$_2$, (NMe$_2$)$_2$Si(NHEt)$_2$, (NMe$_2$)$_2$Si(NH$^n$Pr)$_2$, (NMe$_2$)$_2$Si(NH$^i$Pr)$_2$, (NMe$_2$)$_2$Si(NH$^n$Bu)$_2$, (NMe$_2$)$_2$Si(NH$^i$Bu)$_2$, (NMe$_2$)$_2$Si(NH$^t$Bu)$_2$, (NEt$_2$)$_2$Si(NHMe)$_2$, (NEt$_2$)$_2$Si(NHEt)$_2$, (NEt$_2$)$_2$Si(NH$^n$Pr)$_2$, (NEt$_2$)$_2$Si(NH$^i$Pr)$_2$, (NEt$_2$)$_2$Si(NH$^n$Bu)$_2$, (NEt$_2$)$_2$Si(NH$^i$Bu)$_2$, (NEt$_2$)$_2$Si(NH$^t$Bu)$_2$, (N$^n$Pr$_2$)$_2$Si(NHMe)$_2$, (N$^n$Pr$_2$)$_2$Si(NHEt)$_2$, (N$^n$Pr$_2$)$_2$Si(NH$^n$Pr)$_2$, (N$^n$Pr$_2$)$_2$Si(NH$^i$Pr)$_2$, (N$^n$Pr$_2$)$_2$Si(NH$^n$Bu)$_2$, (N$^n$Pr$_2$)$_2$Si(NH$^i$Bu)$_2$, (N$^n$Pr$_2$)$_2$Si(NH$^t$Bu)$_2$, (N$^i$Pr$_2$)$_2$Si(NHMe)$_2$, (N$^i$Pr$_2$)$_2$Si(NHEt)$_2$, (N$^i$Pr$_2$)$_2$Si(NH$^n$Pr)$_2$, (N$^i$Pr$_2$)$_2$Si(NH$^i$Pr)$_2$, (N$^i$Pr$_2$)$_2$Si(NH$^n$Bu)$_2$, (N$^i$Pr$_2$)$_2$Si(NH$^i$Bu)$_2$, (N$^i$Pr$_2$)$_2$Si(NH$^t$Bu)$_2$, (N$^n$Bu$_2$)$_2$Si(NHMe)$_2$, (N$^n$Bu$_2$)$_2$Si(NHEt)$_2$, (N$^n$Bu$_2$)$_2$Si(NH$^n$Pr)$_2$, (N$^n$Bu$_2$)$_2$Si(NH$^i$Pr)$_2$, (N$^n$Bu$_2$)$_2$Si(NH$^n$Bu)$_2$, (N$^n$Bu$_2$)$_2$Si(NH$^i$Bu)$_2$, (N$^n$Bu$_2$)$_2$Si(NH$^t$Bu)$_2$, (N$^i$Bu$_2$)$_2$Si(NHMe)$_2$, (N$^i$Bu$_2$)$_2$Si(NHEt)$_2$, (N$^i$Bu$_2$)$_2$Si(NH$^n$Pr)$_2$, (N$^i$Bu$_2$)$_2$Si(NH$^i$Pr)$_2$, (N$^i$Bu$_2$)$_2$Si(NH$^n$Bu)$_2$, (N$^i$Bu$_2$)$_2$Si(NH$^i$Bu)$_2$, (N$^i$Bu$_2$)$_2$Si(NH$^t$Bu)$_2$, (N$^t$Bu$_2$)$_2$Si(NHMe)$_2$, (N$^t$Bu$_2$)$_2$Si(NHEt)$_2$, (N$^t$Bu$_2$)$_2$Si(NH$^n$Pr)$_2$, (N$^t$Bu$_2$)$_2$Si(NH$^i$Pr)$_2$, (N$^t$Bu$_2$)$_2$Si(NH$^n$Bu)$_2$, (N$^t$Bu$_2$)$_2$Si(NH$^i$Bu)$_2$, (N$^t$Bu$_2$)$_2$Si(NH$^t$Bu)$_2$, Si(HNCH$_2$CH$_2$NH)$_2$, Si(MeNCH$_2$CH$_2$NMe)$_2$, Si(EtNCH$_2$CH$_2$NEt)$_2$, Si($^n$PrNCH$_2$CH$_2$N$^n$Pr)$_2$, Si($^i$PrNCH$_2$CH$_2$Ni$^i$Pr)$_2$, Si($^n$BuNCH$_2$CH$_2$N$^n$Bu)$_2$, Si($^i$BuNCH$_2$CH$_2$N$^i$Bu)$_2$, Si($^t$BuNCH$_2$CH$_2$N$^t$Bu)$_2$, Si(HNCHCHNH)$_2$, Si(MeNCHCHNMe)$_2$, Si(EtNCHCHNEt)$_2$, Si($^n$PrNCHCHN$^n$Pr)$_2$, Si($^i$PrNCHCHN$^i$Pr)$_2$, Si($^n$BuNCHCHN$^n$Bu)$_2$, Si($^i$BuNCHCHN$^i$Bu)$_2$, Si($^t$BuNCHCHN$^t$Bu)$_2$, (HNCHCHNH)Si(HNCH$_2$CH$_2$NH), (MeNCHCHNMe)Si(MeNCH$_2$CH$_2$NMe), (EtNCHCHNEt)Si(EtNCH$_2$CH$_2$NEt), ($^n$PrNCHCHN$^n$Pr)Si($^n$PrNCH$_2$CH$_2$N$^n$Pr), ($^i$PrNCHCHN$^i$Pr)Si($^i$PrNCH$_2$CH$_2$Ni$^i$Pr), ($^n$BuNCHCHN$^n$Bu)Si($^n$BuNCH$_2$CH$_2$N$^n$Bu), ($^i$BuNCHCHN$^i$Bu)Si($^i$BuNCH$_2$CH$_2$N$^i$Bu), ($^t$BuNCHCHN$^t$Bu)Si($^t$BuNCH$_2$CH$_2$N$^t$Bu), (NH$^t$Bu)$_2$Si(HNCH$_2$CH$_2$NH), (NH$^t$Bu)$_2$Si(MeNCH$_2$CH$_2$NMe), (NH$^t$Bu)$_2$Si(EtNCH$_2$CH$_2$NEt), (NH$^t$Bu)$_2$Si($^n$PrNCH$_2$CH$_2$N$^n$Pr), (NH$^t$Bu)$_2$Si($^i$PrNCH$_2$CH$_2$Ni$^i$Pr), (NH$^t$Bu)$_2$Si($^n$BuNCH$_2$CH$_2$N$^n$Bu), (NH$^t$Bu)$_2$Si($^i$BuNCH$_2$CH$_2$N$^i$Bu), (NH$^t$Bu)$_2$Si($^t$BuNCH$_2$CH$_2$N$^t$Bu), (NH$^t$Bu)$_2$Si(HNCHCHNH), (NH$^t$Bu)$_2$Si(MeNCHCHNMe), (NH$^t$Bu)$_2$Si(EtNCHCHNEt), (NH$^t$Bu)$_2$Si($^n$PrNCHCHN$^n$Pr), (NH$^t$Bu)$_2$Si($^i$PrNCHCHN$^i$Pr), (NH$^t$Bu)$_2$Si($^n$BuNCHCHN$^n$Bu), (NH$^t$Bu)$_2$Si($^i$BuNCHCHN$^i$Bu), (NH$^t$Bu)$_2$Si($^t$BuNCHCHN$^t$Bu), ($^i$PrNCH$_2$CH$_2$Ni$^i$Pr)Si(NHMe)$_2$, ($^i$PrNCH$_2$CH$_2$Ni$^i$Pr)Si(NHEt)$_2$, ($^i$PrNCH$_2$CH$_2$Ni$^i$Pr)Si(NH$^n$Pr)$_2$, ($^i$PrNCH$_2$CH$_2$Ni$^i$Pr)Si(NH$^i$Pr)$_2$, ($^i$PrNCH$_2$CH$_2$Ni$^i$Pr)Si(NH$^n$Bu)$_2$, ($^i$PrNCH$_2$CH$_2$Ni$^i$Pr)Si(NH$^i$Bu)$_2$, ($^i$PrNCH$_2$CH$_2$Ni$^i$Pr)Si(NH$^t$Bu)$_2$, ($^i$PrNCHCHN$^i$Pr)Si(NHMe)$_2$, ($^i$PrNCHCHN$^i$Pr)Si(NHEt)$_2$, ($^i$PrNCHCHN$^i$Pr)Si(NH$^n$Pr)$_2$, ($^i$PrNCHCHN$^i$Pr)Si(NH$^i$Pr)$_2$, ($^i$PrNCHCHN$^i$Pr)Si(NH$^n$Bu)$_2$, ($^i$PrNCHCHN$^i$Pr)Si(NH$^i$Bu)$_2$ and ($^i$PrNCHCHN$^i$Pr)Si(NH$^t$Bu)$_2$, but is not limited thereto.

In the above, $^n$Pr means n-propyl, $^i$Pr means iso-propyl, $^n$Bu means n-butyl, $^i$Bu means iso-butyl, and $^t$Bu means tert-butyl.

In one preferred embodiment, the metal halide may be a titanium tetrahalide, specifically, at least one selected from the group consisting of TiF$_4$, TiCl$_4$, TiBr$_4$, and TiI$_4$, and for example, from an economic standpoint, may more preferably be TiCl$_4$, but the titanium tetrahalide is not limited thereto.

However, since the titanium tetrahalides do not decompose at room temperature but exist in a liquid state due to having excellent thermal stability, a titanium tetrahalide may be usefully employed for the deposition of a thin film as the thin film precursor of ALD.

As an example, the film precursor may be mixed with a non-polar solvent and injected into the chamber. In this case, there is an advantage in that the viscosity or vapor pressure of the film precursor may be easily adjusted.

The non-polar solvent may preferably be one or more selected from the group consisting of alkanes and cycloalkanes. In this case, there is an advantage in that even when including an organic solvent having low reactivity and solubility with easy moisture management capability, the step coverage is improved even if the deposition temperature is increased during formation of the thin film.

In a more preferred embodiment, the non-polar solvent may comprise a C1 to C10 alkane or a C3 to C10 cycloalkane, and preferably a C3 to C10 cycloalkane. In this case, there are advantages in that the reactivity and solubility are low and moisture management may be easily achieved.

In the present disclosure, the notations C1, C3, and the like, represent the number of carbons.

The cycloalkane may preferably be a C3 to C10 monocycloalkane. Among the monocycloalkanes, cyclopentane is a liquid at room temperature and has the highest vapor pressure, which is preferable in the vapor deposition process, but the solvent is not limited thereto.

The non-polar solvent has, for example, a solubility in water (25° C.) of 200 mg/L or less, preferably 50 to 200 mg/L, and more preferably 135 to 175 mg/L. Within this range, there are advantages in that the reactivity for the thin film precursor is low and moisture management may be easily performed.

In the present disclosure, the method employed for the measurement of solubility is not particularly limited as long as the method or standards thereof correspond to those generally used in the art to which the present disclosure pertains, and for example, a saturated solution may be measured by a high performance liquid chromatography (HPLC) method.

The non-polar solvent may preferably be included at a ratio of 5 to 95 wt %, more preferably 10 to 90 wt %, even more preferably 40 to 90 wt %, and most preferably 70 to 90 wt %, based on the total weight of the thin film precursor and the non-polar solvent.

Injection of the non-polar solvent at a content exceeding the upper limit described above may cause impurities, thereby increasing the resistance and number of impurities in the thin film, while injection at a content below the lower limit may cause the effect of improvement of the step coverage and reduction of impurities such as chlorine (Cl) ions, to be obtained through addition of the solvent, to be small.

In the method for forming a thin film, for example, the reduction rate of a thin film growth rate (Å/cycle) per cycle calculated by Equation 1 below may be −5% or less, preferably −10% or less, more preferably −20% or less, even more preferably −30% or less, still more preferably −40% or less, and most preferably −45% or less. Within this range, excellent step coverage and film thickness uniformity may be achieved.

Reduction rate of thin film growth rate per cycle (%)=[(thin film growth rate per cycle when growth inhibitor for forming thin film is used−thin film growth rate per cycle when growth inhibitor for forming thin film is not used)/thin film growth rate per cycle when growth inhibitor for forming thin film is not used]×100   [Equation 1]

In the method for forming a thin film, the residual halogen intensity (c/s) of the thin film formed after 200 cycles, which is measured based on SIMS, may preferably be 10,000 or less, more preferably 8,000 or less, even more preferably 7,000 or less, and still more preferably 6,000 or less. Within this range, excellent prevention of corrosion and deterioration may be achieved.

In the present disclosure, the purging is preferably performed at 1,000 to 10,000 sccm, more preferably at 2,000 to 7,000 sccm, and still more preferably at 2,500 to 6,000 sccm. Within this range, the thin film growth rate per cycle may be reduced to a desirable range and the process byproducts may be reduced.

The atomic layer deposition (ALD) process is very beneficial to preparation of an integrated circuit (IC) that requires a high aspect ratio, and particularly has advantages such as excellent step conformality and uniformity, precise thickness control, and the like, due to the self-limiting thin film growth mechanism.

The method for forming a thin film may be performed, for example, at a deposition temperature in the range of 50 to 900° C., preferably at a deposition temperature in the range of 300 to 700° C., more preferably at a deposition temperature in the range of 350 to 600° C., even more preferably at a deposition temperature in the range of 400 to 550° C., and still more preferably at a deposition temperature in the range of 400 to 500° C. Within this range, it is possible to achieve growth of a thin film with excellent film quality while realizing the ALD process characteristics.

The method for forming a thin film may be performed, for example, at a deposition pressure in the range of 0.1 to 10 Torr, preferably at a deposition pressure in the range of 0.5 to 5 Torr, and most preferably at a deposition pressure in the range of 1 to 3 Torr. Within this range, it is possible to obtain a thin film having uniform thickness.

In the present disclosure, the deposition temperature and deposition pressure may be measured as the temperature and pressure to be formed in the deposition chamber, or may be measured as the temperature and pressure to be applied to the substrate in the deposition chamber.

The method for forming a thin film may preferably comprise steps of raising the temperature in the chamber to a deposition temperature before the injection of the growth inhibitor for forming a thin film into the chamber; and/or injection and purging of an inert gas into the chamber before the injection of the growth inhibitor for forming a thin film.

In addition, the present disclosure may comprise an apparatus for preparing a thin film capable of implementing the method for forming a thin film described in the present disclosure, the apparatus for preparing a thin film comprising an atomic layer deposition (ALD) chamber, a first vaporizer for vaporizing the growth inhibitor for forming a thin film, a first transfer unit for transferring the vaporized growth inhibitor into the ALD chamber, a second vaporizer for vaporizing a metal film precursor, metal oxide film precursor, metal nitride film precursor or silicon nitride film precursor, and a second transfer unit for transferring the vaporized thin film precursor into the ALD chamber. Here, the vaporizer and the transfer unit to be employed are not particularly limited, as long as they are generally used in the art to which the present disclosure pertains.

As a specific example, the method for forming a thin film described as follows.

First, the substrate on which the thin film is to be formed is placed in a deposition chamber capable of atomic layer deposition.

The substrate may comprise a semiconductor substrate such as a silicon substrate, silicon oxide, or the like.

The substrate may further comprise a conductive layer or an insulating layer formed thereon.

In order to deposit the thin film on the substrate placed in the deposition chamber, the above-described growth inhibitor for forming a thin film and the thin film precursor or a mixture of the film precursor compound and the non-polar solvent are prepared, respectively.

Then, the prepared inhibitor for forming a thin film is injected into the vaporizer and converted into a vapor phase, transferred to the deposition chamber, and then adsorbed on the substrate, after which the remaining unadsorbed inhibitor is purged.

Next, the prepared film precursor compound or a mixture of the thin film precursor and the non-polar solvent is injected into the vaporizer and converted into a vapor phase, transferred to the deposition chamber, and then adsorbed on the substrate, after which the unadsorbed composition for forming a thin film is purged.

In the present disclosure, as the method employed for transferring the inhibitor for forming a thin film, the film precursor compound, and the like, to the deposition chamber, for example, a vapor flow control (VFC) method for transferring a volatilized gas through utilization of a mass flow controller (MFC), or a liquid delivery system (LDS) method for transferring a liquid through utilization of a liquid mass flow controller (LMFC), and preferably, the LDS method, may be employed.

Here, as a transfer gas or diluent gas for moving the inhibitor for forming a thin film, the film precursor, and the like, onto the substrate, one or a mixture of two or more gases selected from argon (Ar), nitrogen ($N_2$), and helium (He) may be used, but the gas is not limited thereto.

In the present disclosure, the purge gas may be, for example, an inert gas, and preferably, the transfer gas or dilution gas above.

Next, the reaction gas is supplied. The reaction gas is not particularly limited as long as it is a reaction gas generally used in the art to which the present disclosure pertains, and may preferably comprise a reducing agent, a nitriding agent, or an oxidizing agent. A metal thin film is formed through reaction of the reducing agent with the film precursor adsorbed on the substrate, while a metal nitride thin film is formed through reaction of the nitriding agent and a metal oxide thin film is formed through reaction of the oxidizing agent.

Preferably, the reducing agent may be ammonia gas (NH$_3$) or hydrogen gas (H$_2$), the nitriding agent may be nitrogen gas (N$_2$), and the oxidizing agent may be one or more selected from the group consisting of H$_2$O, H$_2$O$_2$, O$_2$, O$_3$, and N$_2$O.

Next, the unreacted residual reaction gas is purged by using the inert gas. Thus, not only the excess reaction gas but also any generated byproducts may be removed together.

As described above, a unit cycle may comprise steps of adsorbing the inhibitor for forming a thin film on the substrate, purging the unadsorbed inhibitor for forming a thin film, adsorbing the film precursor on the substrate, purging the unadsorbed composition for forming a thin film, supplying a reaction gas, and purging the residual reaction gas, and the unit cycle may be repeated to form a thin film having a desired thickness.

The unit cycle may be performed, for example, from 100 to 1000 times, preferably 100 to 500 times, and more preferably 150 to 300 times. Within this range, the desired thin film characteristics may be well expressed.

Figure 1:
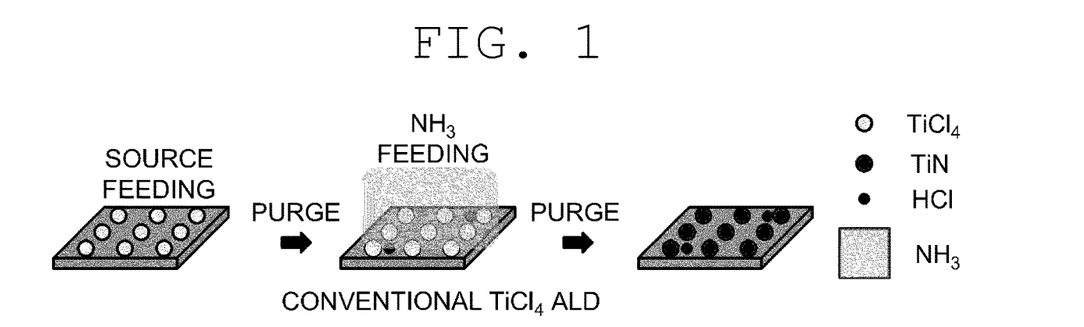
FIG. 1 is a process chart illustrating a conventional atomic layer deposition (ALD) process.
Figure 2:
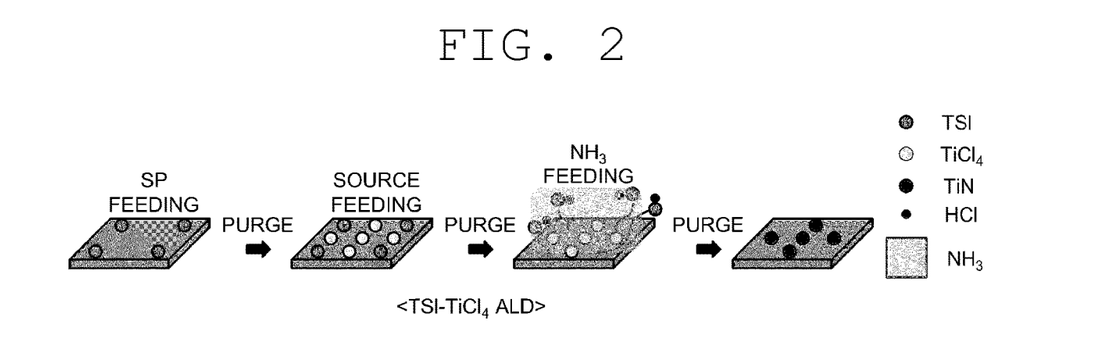
FIG. 2 is a flowchart illustrating an ALD process according to an embodiment of the present disclosure.

FIG. 1 is a process chart illustrating the conventional ALD process, and FIG. 2 is a flowchart illustrating the ALD process according to an embodiment of the present disclosure. Referring to FIG. 1, as in the conventional ALD process, when protection of the surface of the substrate is not achieved by first adsorbing the growth inhibitor for forming a thin film according to the present disclosure before adsorption of the film precursor (for example, TiCl$_4$), process by-products such as HCl remain in the thin film (for example, TiN) due to reaction with the reaction gas (for example, NH$_3$), and thus the performance of the substrate is lowered due to corrosion or deterioration. However, as shown in FIG. 2, when the surface of the substrate is protected (achieving surface protection; SP) by first adsorbing the growth inhibitor (TSI) for forming a thin film according to the present disclosure before adsorption of the film precursor (for example, TiCl$_4$), the process by-products such as HCl generated through reaction with the reaction gas (for example, NH$_3$) at the time of formation of the thin film (for example, TiN) are removed together with the growth inhibitor for forming a thin film, thereby preventing corrosion or deterioration of the substrate, and further, appropriately lowering the thin film growth rate per cycle to improve the step coverage and film thickness uniformity.

The growth inhibitor for forming a thin film of the present disclosure is characterized by a compound represented by Chemical Formula 1 below.

A$n$B$m$X$o$      [Chemical Formula 1]

wherein A is carbon or silicon, B is hydrogen or a C1-C3 alkyl, X is a halogen, n is an integer from 1 to 15, o is an integer of 1 or more, and m is from 0 to 2n+1. In this case, side reactions occurring during formation of the thin film may be suppressed to lower the thin film growth rate while also achieving removal of process byproducts in the thin film, and thus corrosion or deterioration may be reduced and step coverage and thickness uniformity of a thin film may be greatly improved even when the thin film is formed on a substrate having a complex structure.

In Chemical Formula 1, B is preferably hydrogen or methyl, n is preferably an integer from 2 to 15, more preferably an integer from 2 to 10, even more preferably an integer from 2 to 6, and still more preferably an integer from 4 to 6. Within this range, an effect of removing the process byproducts may be large and excellent step coverage may be achieved.

In Chemical Formula 1, X may be one or more selected from the group consisting of, for example, F, Cl, Br and I, and is preferably Cl (chlorine), in which case side reactions may be suppressed and process by-products may be effectively removed.

In Chemical Formula 1, o may preferably be an integer from 1 to 5, more preferably an integer from 1 to 3, and even more preferably may be 1 or 2. Within this range, an effect of reducing the deposition rate may be large, which is more effective for improving the step coverage.

M is preferably from 1 to 2n+1, and more preferably from 3 to 2n+1. Within this range, the effect of removing the process byproducts may be large and excellent step coverage may be achieved.

The compound represented by Chemical Formula 1 may preferably be a branched, cyclic or aromatic compound, and may be specifically one or more selected from the group consisting of 1,1-dichloroethane, 1,2-dichloroethane, dichloromethane, 2-chloropropane, 1-chloropropane, 1,2-dichloropropane, 1,3-dichloropropane, 2,2-dichloropropane, 1-chloropentane, 2-chloropentane, 3-chloropentane, chlorocyclopentane, n-butylchloride, tert-butyl chloride, sec-butyl chloride, isobutyl chloride, 1,2-dichlorobenzene, 1,4-dichlorobenzene, trimethylchlorosilane, trichloropropane, 2-chloro-2-methylbutane, 2-methyl-1-pentane, and the like. In this case, there are advantages in that the effect of removing the process byproducts is large and excellent step coverage is achieved.

The compound represented by Chemical Formula 1 is preferably used in an atomic layer deposition (ALD) process, and in this case, there are advantages in that the compound acts as a growth inhibitor to effectively protect the surface of the substrate and effectively remove process byproducts without interfering with adsorption of the film precursor.

The compound represented by Chemical Formula 1 is preferably a liquid at room temperature (22° C.), may have a density of 0.8 to 1.5 g/cm$^3$, a vapor pressure (20° C.) of 1 to 300 mmHg, and solubility in water (25° C.) of 200 mg/L or less. Within this range, excellent step coverage and thickness uniformity may be achieved.

More preferably, the compound represented by Chemical Formula 1 may have a density of 0.85 to 1.3 g/cm$^3$, a vapor pressure (20° C.) of 1 to 260 mmHg, and solubility in water (25° C.) of 160 mg/L or less. Within this range, excellent step coverage and thickness uniformity of the thin film may be achieved.

The semiconductor substrate of the present disclosure is characterized by being prepared by the method for forming a thin film of the present disclosure, and in this case, it is possible to appropriately lower the thin film growth rate and also remove process byproducts in the thin film by suppressing side reactions, thereby preventing corrosion or deterioration and greatly improving the step coverage and thickness uniformity of the thin film.

The prepared thin film preferably has a thickness of 20 nm or less, a specific resistance value of 0.1 to 400 μΩ·cm, a halogen content of 10,000 ppm or less, and a step coverage of 90% or more. Within this range, the prepared thin film may have excellent performance as a diffusion barrier film, and the corrosion of a metal wiring material may be reduced, but the present disclosure is not limited thereto.

The thin film may have, for example, a thickness of 5 to 20 nm, preferably 10 to 20 nm, even more preferably 15 to 18.5 nm, and still more preferably 17 to 18.5 nm. Within this range, the thin film may have excellent characteristics.

The thin film may have a specific resistance value of, for example, 0.1 to 400 μΩ·cm, preferably 50 to 400 μΩ·cm, more preferably 200 to 400 μΩ·cm, even more preferably 300 to 400 μΩ·cm, still more preferably 330 to 380 μΩ·cm, and most preferably 340 to 370 μΩ·cm. Within this range, the thin film may have excellent characteristics.

The thin film may have a halogen content of more preferably 9,000 ppm or less, or 1 to 9,000 ppm; even more preferably 8,500 ppm or less, or 100 to 8,500 ppm; and still more preferably 8,200 ppm or less, or 1,000 to 8,200 ppm. Within this range, the thin film may have excellent characteristics and the corrosion of the metal wiring material may be reduced.

The thin film may have, for example, a step coverage of 80% or more, preferably 90% or more, and more preferably 92% or more. Within this range, even if a thin film has a complex structure, the thin film is capable of being easily deposited on the substrate, thereby enabling application to a next generation semiconductor device.

The prepared thin film may be, for example, a metal nitride thin film or a metal oxide film, and as a specific example, a TiN thin film or a TiO$_2$ thin film.

Hereinafter, preferable Examples of the present disclosure will be described in order to facilitate understanding of the present disclosure. However, it will be apparent to those skilled in the art that the following Examples are provided only to illustrate the present disclosure, various changes and modifications can be made within the spirit is and the scope of the disclosure, and these variations and modifications are included within the scope of the appended claims.

EXAMPLES

Examples 1 to 7

A growth inhibitor for forming a thin film, shown in Table below, and TiCl$_4$, as a film precursor, were prepared, respectively. The prepared growth inhibitor for forming a thin film was placed in a canister and supplied to a vaporizer heated at 150° C. at a flow rate of 0.05 g/min using a liquid mass flow controller (LMFC) at room temperature. The vaporized growth inhibitor for forming a thin film, converted into the vapor phase in the vaporizer, was injected into a deposition chamber loaded with a substrate for 3 seconds, after which argon purging was performed by supplying argon gas at 3000 sccm for 6 seconds. Here, the pressure in the reaction chamber was controlled to be 1.3 Torr. Next, the prepared TiCl$_4$ was placed in a separate canister and supplied to a separate vaporizer heated at 150° C. at a flow rate of 0.05 g/min using an LMFC at room temperature. The vaporized TiCl$_4$, converted to the vapor phase in the vaporizer, was injected into the deposition chamber for 3 seconds, after which argon purging was performed by supplying argon gas at 3000 sccm for 6 seconds. Here, the pressure in the reaction chamber was controlled to be 1.3 Torr. Next, ammonia as a reaction gas was injected into the reaction chamber for 5 seconds, and then argon purging was performed for 10 seconds. Here, the substrate on which a metal thin film was to be formed was heated to 460° C. This process was repeated 200 times to form a TiN thin film as a self-limiting atomic layer.

TABLE 1

| | Growth inhibitor for forming a thin film |
|---|---|
| Example 1 | 2-chloro-2-methylbutane |
| Example 2 | n-butyl chloride |

TABLE 1-continued

| | Growth inhibitor for forming a thin film |
|---|---|
| Example 3 | trimethylchlorosilane |
| Example 4 | 2-chloropropane |
| Example 5 | 1,2,3-trichloropropane |
| Example 6 | 2-methyl-1-pentane |
| Example 7 | 1,2-dichlorobenzene |

Comparative Example 1

A TiN thin film was formed on a substrate in the same manner as in Example 1, except that the growth inhibitor for forming a thin film was not employed and thus the step of purging the unadsorbed growth inhibitor for forming a thin film was omitted.

Comparative Examples 2 and 3

A TiN thin film was formed on a substrate in the same manner as in Example 1, except that pentane or cyclopentane was used instead of the growth inhibitor for forming a thin film described in Table 1 above.

Experimental Example

1) Deposition Evaluation

Referring to Table 2 below, Example 1, in which chloro-2-methylbutane was used as the growth inhibitor for forming a thin film, was compared with Comparative Example 1, in which the growth inhibitor for forming a thin film was not included. As a result, the deposition rate of Example 1 was 0.20 Å/cycle, which represents a reduction of over 55.5% when compared with the deposition rate of Comparative Example 1. It could be confirmed that Examples 2 to 7 also had deposition rates similar to that of Example 1. Further, it could be confirmed that Comparative Examples 2 and 3, using pentane or cyclopentane instead of the growth inhibitor for forming a thin film according to the present disclosure, also had a deposition rate equal to that of Comparative Example 1. Here, the reduction in deposition rate means that the CVD deposition characteristics are changed to ALD deposition characteristics, and thus may be used as an index for improvement of the step coverage characteristics.

TABLE 2

| | Growth Inhibitor | Deposition Rate (Å/cycle) |
|---|---|---|
| Example 1 | 2-chloro-2-methylbutane | 0.20 |
| Example 2 | n-butyl chloride | 0.31 |
| Example 3 | trimethylchlorosilane | 0.28 |
| Example 4 | 2-chloropropane | 0.20 |
| Example 5 | 1,2,3-trichloropropane | 0.32 |
| Example 6 | 2-methyl-1-pentane | 0.28 |
| Example 7 | 1,2-dichlorobenzene | 0.30 |
| Comparative Example 1 | X | 0.45 |
| Comparative Example 2 | Pentane | 0.45 |
| Comparative Example 3 | Cyclopentane | 0.45 |

In addition, as shown in Table 3, it could be confirmed that the deposition rate was continuously reduced according to the feeding amount of chloro-2-methylbutane, the growth inhibitor for forming a thin film. Here, Example 1-1 was performed in the same manner as in Example 1, except for the feeding amount of the growth inhibitor for forming a thin film per cycle.

TABLE 3

|  | Comparative Example 1 | Example 1 | Example 1-1 |
|---|---|---|---|
| Feeding amount per ALD cycle (mg/cycle) | 0 | 1.6 | 3.2 |
| Deposition rate (Å/cycle) | 0.45 | 0.20 | 0.02 |

2) Impurity Reduction Characteristics

SIMS analysis was performed to compare the impurity reduction characteristics, that is, the process byproduct reduction characteristics, of the TiN thin films deposited in Example 1 and Comparative Example 1, the results of which are shown in Table 4 below.

TABLE 4

|  | Example 1 | Comparative Example 1 |
|---|---|---|
| Feeding amount per ALD cycle (mg/cycle) | 1.6 | 0 |
| Cl intensity (c/s) | 5907.05 | 17270.25 |

As shown in Table 4, it could be confirmed that the impurities of Example 1, in which the growth inhibitor for forming a thin film according to the present disclosure was employed, were reduced to about ⅓ the amount in comparison to Comparative Example 1, in which the growth inhibitor was not employed.

Figure 3:
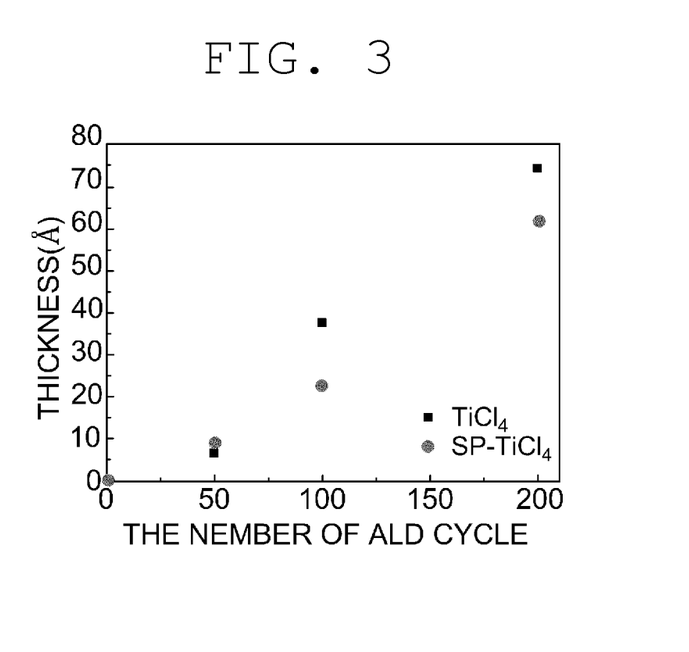
FIG. 3 is a graph illustrating the change in thin film thickness according to the increase in ALD cycle for Example 7 (SP-$TiCl_4$) and Comparative Example 1 ($TiCl_4$) of the present disclosure.

Further, FIG. 3 is a graph showing the change in thickness of the thin film according to the increase in atomic layer deposition (ALD) cycle of Example 7 (SP-TiCl$_4$) and Comparative Example 1 (TiCl$_4$) of the present disclosure, wherein it could be confirmed that the thickness of the thin film in Example 7 became significantly thinner.

Figure 4:
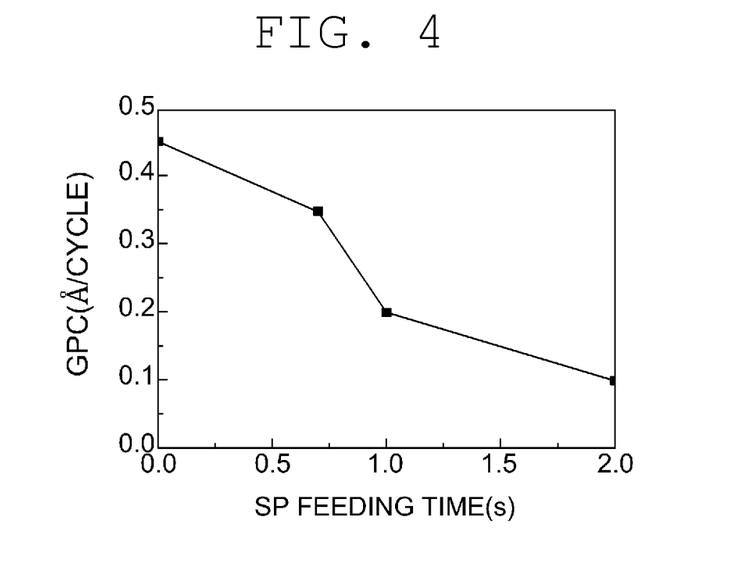
FIG. 4 is a graph illustrating the change in deposition rate according to feeding time of growth inhibitor (SP) for forming a thin film per ALD cycle for Examples 7-1 to 7-3 and Comparative Example 1 of the present disclosure.

In addition, FIG. 4 is a graph illustrating the change in deposition rate according to the feeding time of a growth inhibitor (SP) for forming a thin film per ALD cycle of Examples 7-1 to 7-3 and Comparative Example 1 of the present disclosure, wherein it could be confirmed that when the inhibitor for forming a thin film according to the present disclosure was not used, as in Comparative Example 1, the deposition rate was 0.45 Å/cycle, whereas in Examples 7-1, 7-2, and 7-3, in which the growth inhibitor for forming a thin film according to the present disclosure was injected in an amount of 0.7 sec, 1 sec, and 2 sec, respectively, the deposition rate was significantly thinned to 0.35 Å/cycle, 0.2 Å/cycle, and 0.1 Å/cycle, respectively. Here, Examples 7-1, 7-2, and 7-3 were performed in the same manner as in Example 7, except for the feeding amount of the growth inhibitor for forming a thin film.

3) Step Coverage Characteristics

The step coverage of TiN thin films deposited in Example 1 and Comparative Example 1 were confirmed by TEM, the results of which are shown in Table 5 below and FIG. 5.

TABLE 5

|  | Example 1 | Comparative 1 |
|---|---|---|
| Step coverage rate (%) | 92% | 78% |

As shown in Table 5, it could be confirmed that the step coverage of Example 1, in which the growth inhibitor for forming a thin film according to the present disclosure was employed, was significantly higher than that of Comparative Example 1, in which the growth inhibitor was not employed.

Figure 5:
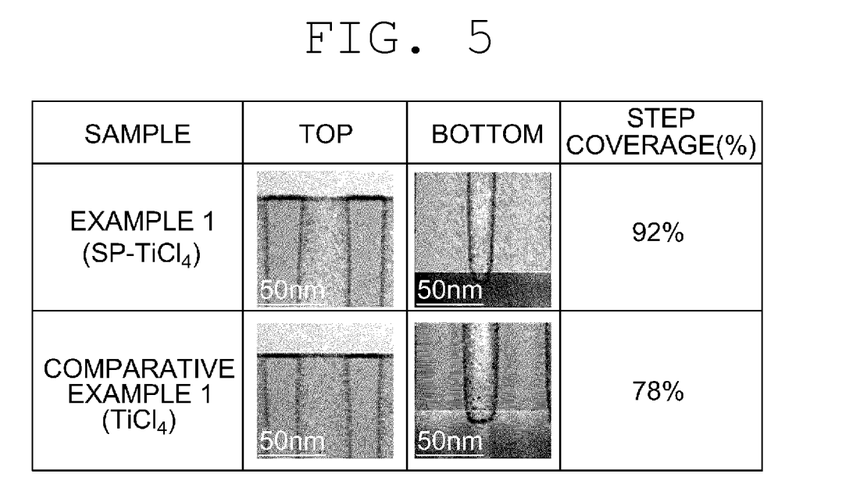
FIG. 5 illustrates transmission electron microscope (TEM) images of TiN thin films deposited for Example 1 (SP-$TiCl_4$) and Comparative Example 1 ($TiCl_4$) of the present disclosure.

In addition, referring to the TEM images shown in FIG. 5, it could be confirmed that in view of the thickness uniformity of the top and bottom, the step conformality of the TiN thin film deposited in Example 1 (SP-TiCl$_4$) was more excellent as compared to the TiN thin film deposited in Comparative Example 1 (TiCl$_4$).

Additional Example 1

A zirconium oxide film (ZrO$_2$ thin film) was formed by the same method as in Example 1 above, except that tris(dimethylamino)cyclopentadienyl zirconium (CpZr) was used as a film precursor instead of TiCl$_4$, the growth inhibitor for forming a thin film was injected into the chamber at an amount of 12 mg/sec, ozone was used as a reaction gas instead of ammonia, and the substrate on which the metal thin film was to be formed was heated to 280 to 340° C.

Additional Example 2

A zirconium oxide film (ZrO$_2$ thin film) was formed by the same method as in Additional Example 1, except that the growth inhibitor for forming a thin film was injected into the chamber at an amount of 2.3 mg/sec for 1 to 7 seconds, respectively, and the substrate on which the metal thin film was to be formed was heated to 310° C.

Additional Comparative Example 1

A zirconium oxide film (ZrO$_2$ thin film) was formed by the same method as in Additional Example 1, except that the growth inhibitor for forming a thin film was not employed.

The deposition rate, reduction rate (%), and thickness uniformity (%) were measured for the zirconium oxide films deposited in Additional Examples 1 and 2 and Additional Comparative Example 1, the results of which are shown in Table 6 below and FIG. 6. Here, the thickness uniformity (%) was calculated by Equation 2, as follows:

$$\text{Thickness uniformity (\%)} = [(\text{MAX}-\text{MIN})/(2*\text{AVERAGE})]*100\% \quad \text{[Equation 2]}$$

wherein the MAX, MIN, and AVERAGE represent the maximum value, the minimum value, and the average value of the thickness, and each optical thickness was measured using ellipsometer equipment.

TABLE 6

|  |  | Temp (° C.) | 280 | 290 | 300 | 310 | 320 | 330 | 340 |
|---|---|---|---|---|---|---|---|---|---|
| Additional Example 1 | SP-CpZr (Å/cycle) | | 0.510 | 0.508 | 0.510 | 0.510 | 0.510 | 0.511 | 0.510 |
|  | reduction rate (%) | | 34.6 | 35.5 | 35.9 | 36.1 | 36.6 | 40.1 | 42.3 |
|  | Uniformity (%) | | 1.1 | 2.1 | 1.6 | 1.5 | 1.7 | 1.5 | 1.8 |

TABLE 6-continued

| | Temp (° C.) | 280 | 290 | 300 | 310 | 320 | 330 | 340 |
|---|---|---|---|---|---|---|---|---|
| Additional Comparative Example 1 | CpZr (Å/cycle) | 0.781 | 0.788 | 0.796 | 0.798 | 0.805 | 0.854 | 0.884 |
| | Uniformity (%) | 1.4 | 1.1 | 1.2 | 1.6 | 3.1 | 4.3 | 3.8 |

As shown in Table 6, in the zirconium oxide film (Additional Example 1) formed by using the growth inhibitor for forming a thin film according to the present disclosure, as compared to the zirconium oxide film (Additional Comparative Example 1) formed without employment of the growth inhibitor according to the present disclosure, it could be confirmed that the thin film thickness per ALD cycle according to the deposition temperature was very constant at 0.508 to 0.511 Å, while simultaneously, the reduction rate was greatly decreased to the range of 34.6 to 42.3%, and further, the film thickness uniformity was in the range of 1.1 to 2.1%, indicating a very small fluctuation range.

Figure 6:
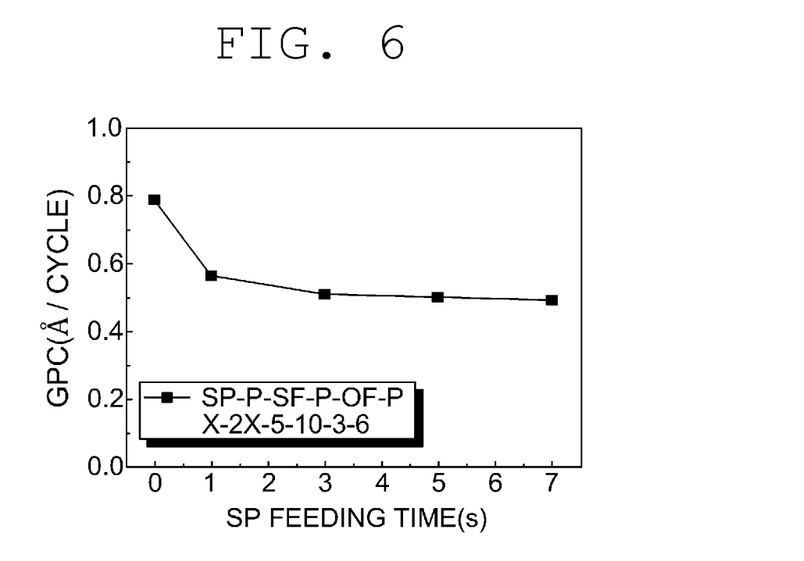
FIG. 6 is a graph illustrating the change in deposition rate (Å/cycle) according to feeding time (s) of a growth inhibitor (SP) for forming a thin film per ALD cycle for Additional Example 2 and Additional Comparative Example 1 of the present disclosure.

Further, FIG. 6 is a graph illustrating the change in deposition rate (Å/cycle) according to the feeding time (s) of the growth inhibitor (SP) for forming a thin film per ALD cycle for Additional Example 2 and Additional Comparative Example 1 of the present disclosure, wherein it could be confirmed that when the inhibitor for forming a thin film according to the present disclosure was not employed, as in Additional Comparative Example 1, the deposition rate per cycle was about 0.8 Å/cycle, whereas in Additional Example 2 in which the growth inhibitor for forming a thin film according to the present disclosure was injected for 1 second, 3 seconds, 5 seconds, and 7 seconds, respectively, the deposition rate was significantly lowered to about 0.56 Å/cycle, 0.52 Å/cycle, 0.51 Å/cycle, and 0.50 Å/cycle, respectively. Here, SP-PS-FP-OF-P means 1 cycle comprising injection of the growth inhibitor (SP) for forming a thin film, injection of a purge gas (P), injection of a thin film precursor (SF), injection of a purge gas (P), injection of a reaction gas (OF), and injection of a purge gas (F), X-2X-5-10-3-6 means the feeding time S of each step, and X is an integer of 0 to 7.

As set forth above, according to the present disclosure, it is possible to provide a method for forming a thin film capable of suppressing side reactions and reducing a deposition rate to appropriately lower a thin film growth rate while also removing process byproducts in the thin film, thereby preventing corrosion or deterioration and greatly improving step coverage and thickness uniformity of the thin film, even when the thin film is formed on a substrate having a complex structure.

What is claimed is:

1. A method for forming a thin film comprising steps of:
    i) adsorbing a growth inhibitor for forming a thin film on a surface of a substrate; and ii) adsorbing a metal film precursor, metal oxide film precursor, metal nitride film precursor or silicon nitride film precursor on a surface of a substrate on which the growth inhibitor is adsorbed, and the metal is zirconium,
    wherein the growth inhibitor is one or more selected from the group consisting of 1,1-dichloroethane, 1,2-dichloroethane, dichloromethane, 2-chloropropane, 1-chloropropane, 1,2-dichloropropane, 1,3-dichloropropane, 2,2-dichloropropane, 1-chloropentane, 2-chloropentane, 3-chloropentane, chlorocyclopentane, n-butyl chloride, tert-butyl chloride, sec-butyl chloride, isobutyl chloride, 1,2-dichlorobenzene, 1,4-dichlorobenzene, trichloropropane, 2-chloro-2-methylbutane, and 2-methyl-1-pentene, and
    wherein in the step of i) adsorbing the growth inhibitor for forming a thin film on the surface of the substrate, a feeding amount of the growth inhibitor is 1-25 mg/cycle.

2. The method for forming a thin film of claim 1, wherein in the step of i) adsorbing the growth inhibitor for forming a thin film on the surface of the substrate, the feeding time for the growth inhibitor is 2 to 5 seconds.

3. The method for forming a thin film of claim 1, wherein the step of i) adsorbing the growth inhibitor for forming a thin film on the surface of the substrate comprises a step of injecting the growth inhibitor for forming a thin film into an atomic layer deposition (ALD) chamber and adsorbing the growth inhibitor onto a surface of a loaded substrate.

4. The method for forming a thin film of claim 1, wherein the step of i) adsorbing the growth inhibitor for forming a thin film on the surface of the substrate comprises a step of purging the remaining inhibitor unadsorbed on the surface of the substrate for forming the thin film with a purge gas.

5. The method for forming a thin film of claim 1, wherein the step of ii) adsorbing a film precursor comprises a step of purging the remaining unadsorbed film precursor with a purge gas.

6. The method for forming a thin film of claim 1, further comprising steps of supplying a reaction gas after adsorption of a film precursor on the surface of the substrate, and purging reaction byproducts of the film precursor and the reaction gas with a purge gas.

7. The method for forming a thin film of claim 6, wherein the reaction gas comprises a reducing agent, a nitriding agent, or an oxidizing agent.

8. The method for forming a thin film of claim 1, wherein the growth inhibitor for forming a thin film and the film precursor are transferred into the ALD chamber by a vapor flow control (VFC) method, a delivery liquid injection (DLI) method, or a liquid delivery system (LDS) method.

9. The method for forming a thin film of claim 1, wherein a ratio of the feeding amount (mg/cycle) between the growth inhibitor for forming a thin film and the film precursor in the ALD chamber is from 1:1.5 to 1:20.

10. The method for forming a thin film of claim 1, wherein a reduction rate of a thin film growth rate per cycle (Å/cycle) calculated by the following Equation 1 is −5% or less:

Reduction rate of thin film growth rate per cycle (%)=[(thin film growth rate per cycle when growth inhibitor for forming thin film is used−thin film growth rate per cycle when growth inhibitor for forming thin film is not used)/thin film growth rate per cycle when growth inhibitor for forming thin film is not used]×100  [Equation 1].

11. The method for forming a thin film of claim 1, wherein the residual halogen intensity (c/s) of the thin film formed after 200 cycles, which is measured based on SIMS, is 10,000 or less.

12. The method for forming a thin film of claim 1, wherein the metal precursor comprises tris(dimethylamino) cyclopentadienyl zirconium.

13. The method for forming a thin film of claim 1, wherein the thin film is a diffusion barrier film.

14. The method for forming a thin film of claim 1, wherein in the step of i) adsorbing the growth inhibitor for forming a thin film on the surface of the substrate, a feeding amount of the growth inhibitor is 1-25 mg/cycle, and
wherein a reduction rate of a thin film growth rate per cycle (Å/cycle) calculated by the following Equation 1 is −45% or less:

$$\text{Reduction rate of thin film growth rate per cycle (\%)} = [(\text{thin film growth rate per cycle when growth inhibitor for forming thin film is used} - \text{thin film growth rate per cycle when growth inhibitor for forming thin film is not used})/\text{thin film growth rate per cycle when growth inhibitor for forming thin film is not used}] \times 100 \quad [\text{Equation 1}].$$

\* \* \* \* \*